(12) United States Patent
Okada et al.

(10) Patent No.: US 9,299,632 B2
(45) Date of Patent: Mar. 29, 2016

(54) SEMICONDUCTOR DEVICE

(71) Applicant: Renesas Electronics Corporation, Kawasaki-shi (JP)

(72) Inventors: Makio Okada, Kawasaki (JP); Takehiko Maeda, Kawasaki (JP)

(73) Assignee: RENESAS ELECTRONICS CORPORATION, Kawasaki-shi, Kanagawa (JP)

( * ) Notice: Subject to any disclaimer, the term of this patent is extended or adjusted under 35 U.S.C. 154(b) by 0 days.

(21) Appl. No.: 14/460,223

(22) Filed: Aug. 14, 2014

(65) Prior Publication Data

US 2015/0061159 A1 Mar. 5, 2015

(30) Foreign Application Priority Data

Sep. 3, 2013 (JP) ................................. 2013-182362

(51) Int. Cl.
*H01L 23/31* (2006.01)
*H01L 23/00* (2006.01)

(52) U.S. Cl.
CPC ............ *H01L 23/3192* (2013.01); *H01L 24/06* (2013.01); *H01L 24/05* (2013.01); *H01L 2224/02166* (2013.01); *H01L 2224/05553* (2013.01); *H01L 2224/05624* (2013.01); *H01L 2224/0603* (2013.01); *H01L 2224/06131* (2013.01); *H01L 2224/06133* (2013.01); *H01L 2224/06179* (2013.01); *H01L 2224/32013* (2013.01); *H01L 2224/32014* (2013.01); *H01L 2224/32245* (2013.01); *H01L 2224/48091* (2013.01); *H01L 2224/48227* (2013.01); *H01L 2224/48247* (2013.01); *H01L 2224/49431* (2013.01); *H01L 2224/73265* (2013.01); *H01L 2924/00014* (2013.01); *H01L 2924/10161* (2013.01); *H01L 2924/15311* (2013.01); *H01L 2924/35121* (2013.01)

(58) Field of Classification Search
CPC .............................. H01L 24/02; H01L 24/04
USPC .......................... 257/781, 736, 786, 779, 784
See application file for complete search history.

(56) References Cited

U.S. PATENT DOCUMENTS

| 7,541,275 | B2 * | 6/2009 | Mercer et al. | 438/614 |
|---|---|---|---|---|
| 2005/0269702 | A1 | 12/2005 | Otsuka | |
| 2007/0246828 | A1 * | 10/2007 | Nakatani | 257/737 |
| 2008/0036086 | A1 * | 2/2008 | Ishio | 257/738 |
| 2009/0001364 | A1 * | 1/2009 | Segawa et al. | 257/48 |
| 2011/0248406 | A1 * | 10/2011 | Wada et al. | 257/773 |

FOREIGN PATENT DOCUMENTS

JP H 6-163629 A 6/1994

OTHER PUBLICATIONS

European Search Report dated Jun. 24, 2015.

* cited by examiner

*Primary Examiner* — Cuong Q Nguyen
*Assistant Examiner* — Tong-Ho Kim
(74) *Attorney, Agent, or Firm* — McGinn IP Law Group PLLC

(57) ABSTRACT

Even when a thermal stress is applied to an electrode pad, the electrode pad is prevented from being moved. A substrate of a semiconductor chip has a rectangular planar shape. The semiconductor chip has a plurality of electrode pads. The center of a first electrode pad is positioned closer to the end of a first side in the direction along the first side of the substrate as compared to the center of a first opening. Thus, in a part of the first electrode pad covered with an insulating film, a width of the part closer to the end of the first side in the direction along the first side is larger than another width of the part opposite to the above-mentioned width.

14 Claims, 9 Drawing Sheets

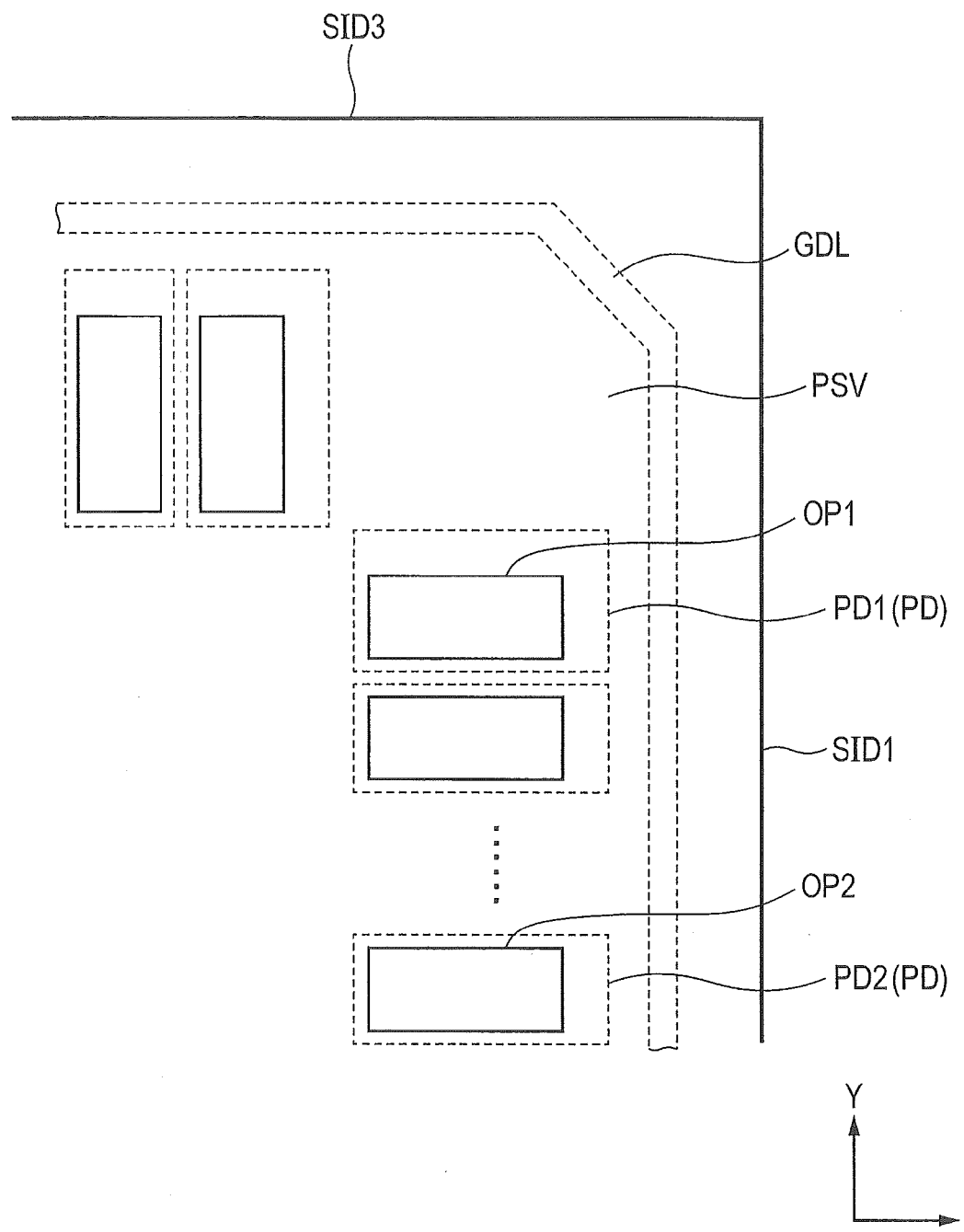

SEMICONDUCTOR DEVICE

CROSS-REFERENCE TO RELATED APPLICATIONS

The disclosure of Japanese Patent Application No. 2013-182362 filed on Sep. 3, 2013 including the specification, drawings and abstract is incorporated herein by reference in its entirety.

BACKGROUND

The present invention relates to semiconductor devices, and more particularly, to a technique that can be applied to a semiconductor device with electrode pads.

Semiconductor chips have electrode pads serving as a terminal for external connection. The electrode pad is exposed outward from an opening provided in a protective insulating film as disclosed in, for example, Patent Document 1. Patent Document 1 also describes that the center of the opening provided in the protective insulating film is displaced from the center of the electrode pad in a direction perpendicular to the edge of the semiconductor chip.

RELATED ART DOCUMENTS

Patent Documents

[Patent Document 1] Japanese Unexamined Patent Publication No. Hei 06(1994)-163629

SUMMARY

In recent years, power consumption of semiconductor chips has been increasing. For this reason, the inventors have studied the effect of increasing the thickness of electrode pads so as to suppress a wiring resistance of the inside of a wiring layer.

On the other hand, the semiconductor chip is mounted over a wiring substrate, such as a lead frame or an interposer, and then sealed with a seal resin. A thermal expansion coefficient of the seal resin differs from that of an insulator or metal used in the wiring layer. As a result, thermal stress is generated at an interface between the seal resin and the semiconductor chip. However, when the thickness of the electrode pad is increased as mentioned above, the thermal stress might be applied to the electrode pad, possibly moving the pad.

Other problems and new features of the present invention will be clarified in the detailed description below in connection with the accompanying drawings.

According to one embodiment of the invention, a multilayer interconnection layer is formed over a rectangular substrate. A plurality of electrode pads is formed in an uppermost wiring layer of the multilayer interconnection layer. The electrode pads are arranged along a first side of the substrate. When the electrode pad closest to one end of the first side is defined as a first electrode pad, and the opening positioned over the first electrode pad is defined as a first opening, a center of the first electrode pad is positioned closer to the one end in a direction along the first side as compared to a center of the first opening.

The above-mentioned embodiment of the invention can prevent the electrode pad from moving even when the thermal stress is applied to the electrode pad.

BRIEF DESCRIPTION OF THE DRAWINGS

FIG. 3 is a diagram for explaining the position of a first opening with respect to a first electrode pad, and the position of a second opening with respect to a second electrode pad;

DETAILED DESCRIPTION

Figure 1:
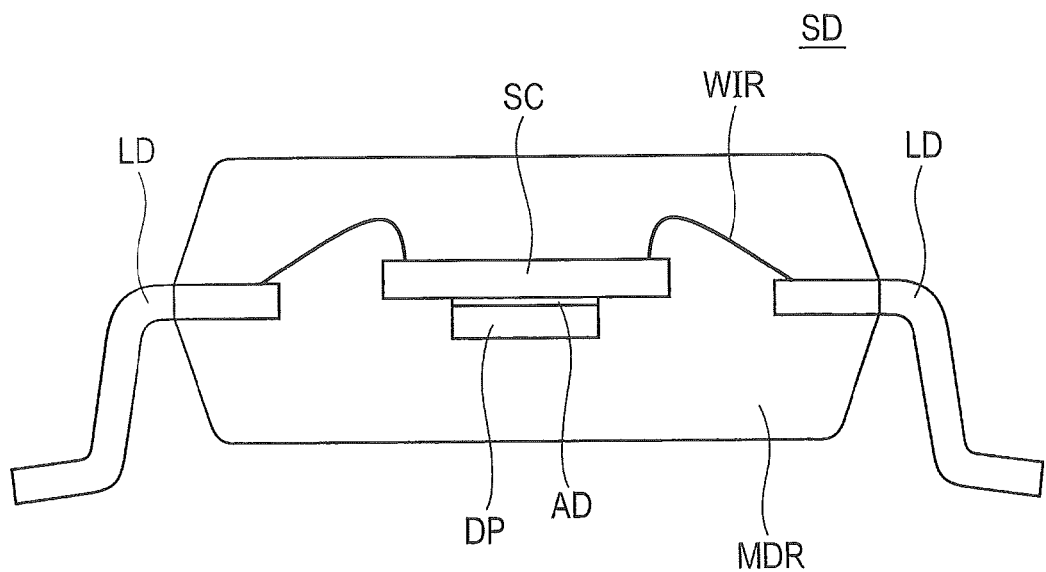
FIG. 1 is a cross-sectional view showing the structure of a semiconductor device according to one embodiment of the invention.

In the following, preferred embodiments of the present invention will be described with reference to the accompanying drawings. Wherever possible, the same reference numerals will be used through the drawings to refer to the same or like parts, and thus a description thereof will be omitted below.

Embodiment

FIG. 1 shows a cross-sectional view of the structure of a semiconductor device SD according to one embodiment of the invention. The semiconductor device SD of this embodiment includes a semiconductor chip SC sealed with a seal resin MDR. Specifically, the semiconductor chip SC is held over a substrate mounting portion DP with an electrode formation surface of the chip faced upward. The substrate mounting portion DP is, for example, a die pad of a lead frame. The semiconductor chip SC is coupled to lead terminals LD via bonding wires WIR. The bonding wire WIR, and a coupling portion of the lead terminal LD with the bonding wire WIR are sealed with the seal resin MDR. One end of the lead terminal LD extends to the outside of the seal resin MDR.

In an example shown in the figure, the substrate mounting portion DP is smaller than the semiconductor chip SC. Alternatively, the substrate mounting portion DP may be larger than the semiconductor chip SC.

Figure 2:
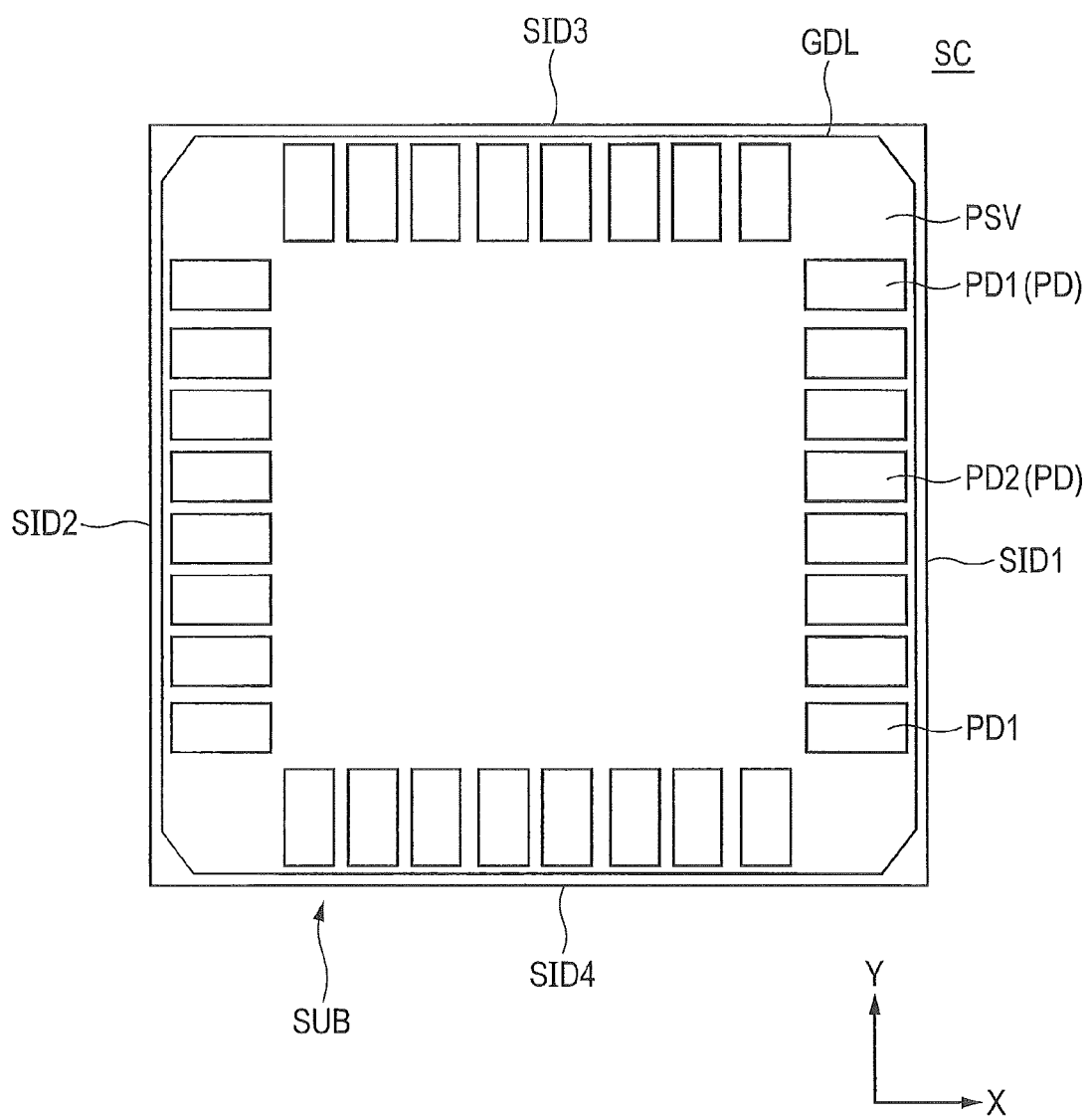
FIG. 2 is a plan view of a semiconductor chip.

FIG. 2 shows a plan view of the semiconductor chip SC. A substrate SUB of the semiconductor chip SC has a rectangular planar shape. The semiconductor chip SC includes a plurality of electrode pads PD. Each electrode pad PD has, for example, an oblong planar shape. The electrode pad PD is coupled to one end of the bonding wire WIR shown in FIG. 1.

The electrode pads PD are arranged along at least a first side SID1 of the substrate SUB. In the example shown in the figure, the electrode pads PD are arranged not only along the first side SID1 of the substrate SUB, but also along a side (second side SID1) opposed to the first side SID1, and the remaining two sides (third side SIDS and fourth side SID 4). The short sides of the electrode pad PD are disposed in parallel with one of the four sides of the substrate SUB located closest to the electrode pad PD.

In the example shown in the figure, the electrode pads PD are arranged in line. Although the electrode pads PD are arranged at equal intervals, at least some electrode pads PD may be spaced apart from each other by a distance different from that between other electrode pads PD. The semiconductor chip SC is provided with a guard ring GDL. The electrode pads PD are positioned in a region enclosed by the guard ring GDL.

An insulating film PSV is formed as the uppermost layer of the semiconductor chip SC. The insulating film PSV is, for example, a film that is called a passivation film, and has, for example, a laminate of a silicon oxide film and a silicon nitride film which are stacked in that order. The insulating film PSV serves to protect a multilayer interconnection layer MINC of the semiconductor chip SC (to be described later using FIG. 5). The insulating film PSV is provided with openings OP (to be described later using FIG. 3) positioned over the respective electrode pads PD. The relative position between the electrode pad PD closest to the corner of the substrate SUB among the electrode pads PD (hereinafter referred to as a "first electrode pad PD1") and the opening OP positioned over the above-mentioned electrode pad (hereinafter referred to as a "first opening OP1") differs from the relative position between the electrode pad PD closest to the center of each side of the substrate among the electrode pads PD (hereinafter referred to as a "second electrode pad PD2") and the opening OP positioned over the above-mentioned electrode pad (hereinafter referred to as a "second opening OP2"). The difference in relative position will be described below with reference to FIGS. 3 and 4.

Figure 4A:
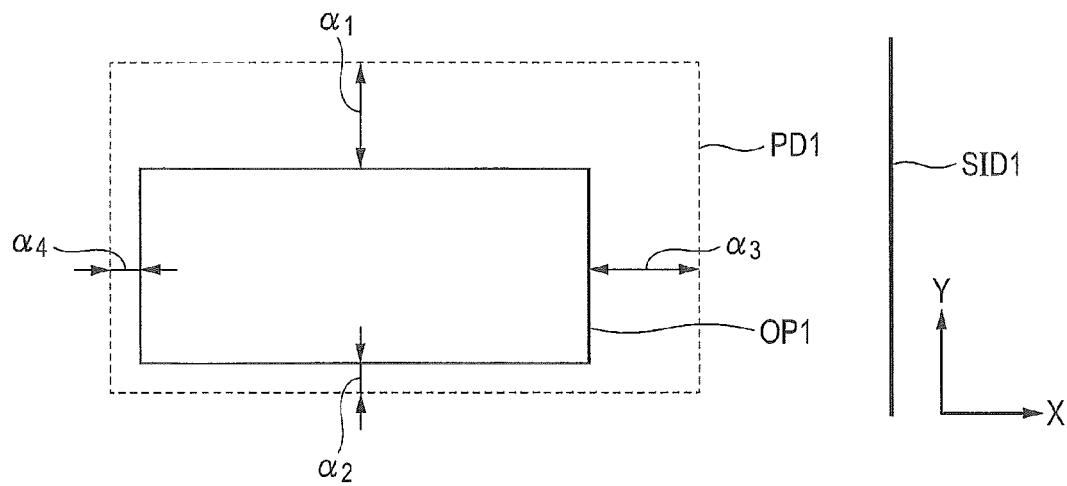
FIG. 4A is a diagram showing the position of the first opening with respect to the first electrode pad.
Figure 4B:
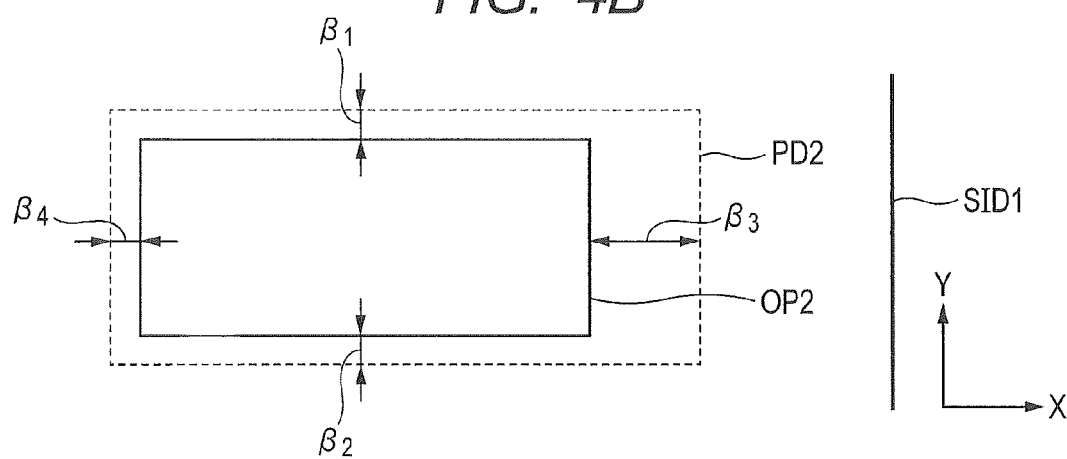
FIG. 4B is a diagram showing the position of the second opening with respect to the second electrode pad.

FIG. 3 shows a diagram for explaining the position of the first opening OP1 with respect to the first electrode pad PD1, and the position of the second opening OP2 with respect to the second electrode pad. FIG. 4A shows a diagram for explaining the position of the first opening OP1 with respect to the first electrode pad PD1. FIG. 4B shows a diagram for explaining the position of the second opening OP2 with respect to the second electrode pad PD2.

As shown in FIG. 3, the center of the first electrode pad PD1 is positioned closer to the end of the first side SID1 as compared to the center of the first opening OP1 in the direction along the first side SID1 (in the direction Y of the figure). Thus, as shown in FIG. 4A, as to a part of the first electrode pad PD1 covered with the insulating film PSV in the direction along the first side SID1, a width of the part closer to the end of the first side SID1 (on the upper side of the figure) is larger than another width of the part opposite to the above-mentioned width (on the lower side of the figure). In detail, as mentioned above, the short side of the first electrode pad PD1 is parallel with the first side SID1. A distance $\alpha_1$ from one of two long sides of the first electrode pad PD1 closer to the end of the first side SID1 (or the long side on the upper side of the figure) to the edge of the first opening OP1 is larger than a distance $\alpha_2$ from the remaining long side of the first electrode pad PD1 (or the short side on the lower side of the figure) to another edge of the first opening OP1. The distance $\alpha_1$ is, for example, in a range of not less than 5 μm nor more than 20 μm, and the distance $\alpha_2$ is, for example, in a range of not less than 1 μm nor more than 5 μm. A distance $\alpha_3$ from one of the short sides of the first electrode pad PD1 closer to the first side SID1 to another edge of the first opening OP1 is larger than a distance $\alpha_4$ from the remaining short side of the first electrode pad PD1 to another edge of the first opening OP1. The distance $\alpha_3$ is, for example, in a range of not less than 5 μm nor more than 20 μm, and the distance $\alpha_4$ is, for example, in a range of not less than 1 μm nor more than 5 μm.

On the other hand, as shown in FIG. 3, the center of the second electrode pad PD2 is substantially superimposed over the center of the second opening OP2 in the direction along the first side SID1 (in the direction Y of the figure). In detail, distances $\beta_1$ and $\beta_2$ from the respective two long sides of the second electrode pad PD2 to the edge of the first opening OP1 are equal to each other. The distance $\beta_1$ is, for example, in a range of not less than 1 μm nor more than 5 μm. Due to a manufacturing error, the center of the second electrode pad PD2 is sometimes located closer to the end of the first side SID1 as compared to the center of the second opening OP2. Even in this case, however, a distance from the center of the second electrode pad PD2 to the center of the second opening OP2 is also smaller than that from the center of the first electrode pad PD1 to the center of the first opening OP1. A distance $\beta_3$ from one of the short sides of the second electrode pad PD2 closer to the second side SID2 to the edge of the second opening OP2 is larger than a distance $\beta_4$ from the remaining short side of the second electrode pad PD2 to another edge of the second opening OP2. The distances $\beta_3$ and $\beta_4$ are substantially equal to the distances $\alpha_3$ and $\alpha_4$, respectively.

In the example shown in the figure, the width of the first electrode pad PD1 is set larger than that of the second electrode pad PD2 in the direction along the first side SID1, so that the above-mentioned relative position can be achieved with the size of the first opening OP1 equal to that of the second opening OP2. In this way, the first opening OP1 does not need to be decreased in size, and thus can ensure an area for coupling between the first electrode pad PD1 and the bonding wire WIR.

Figure 5A:
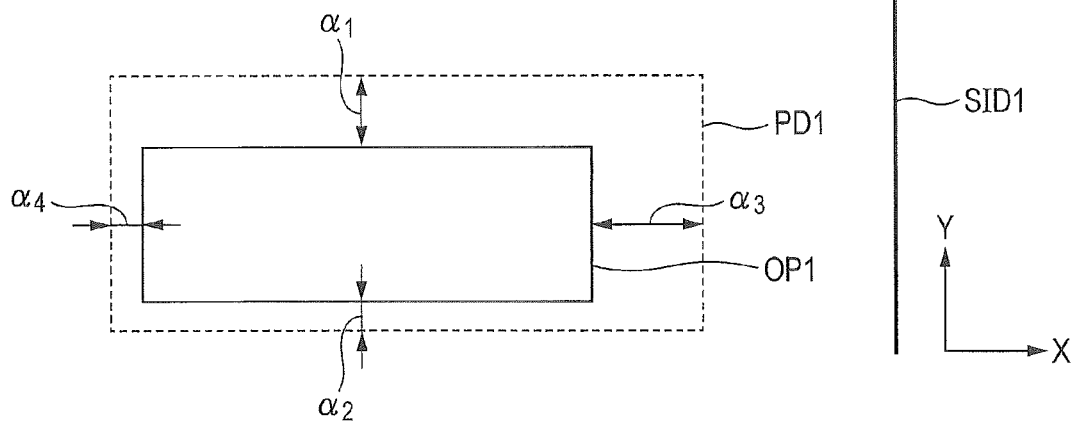
FIGS. 5A and 5B are diagrams showing modified examples of FIGS. 4A and 4B.
Figure 5B:
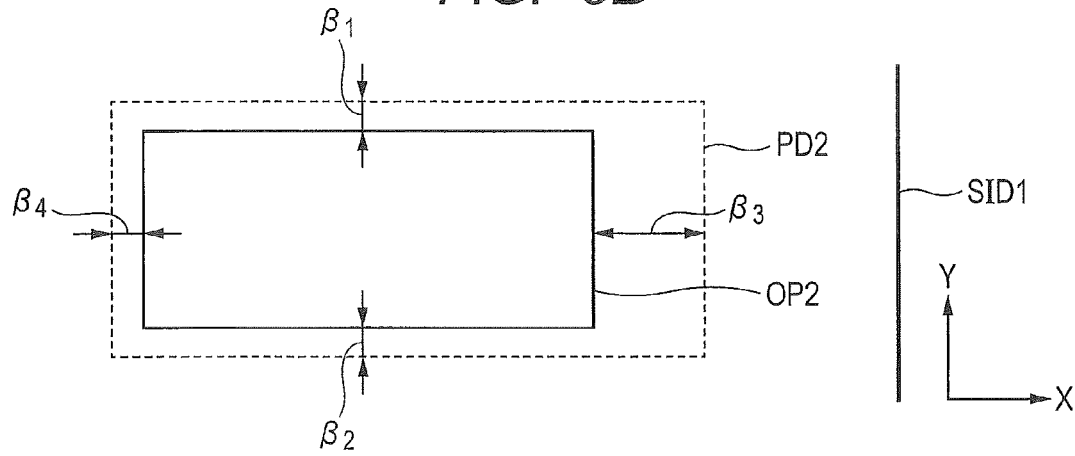

As shown in FIG. 5, a width of the first opening OP1 in the direction along the first side SID1 is set smaller with respect to the first opening OP1, so that the above-mentioned relative position may be achieved with the size of the first electrode pad PD1 being the same as that of the second electrode pad PD2.

In an example shown in FIG. 3, the relative position between the electrode pad PD other than the first electrode pad PD1 and the openings OP thereover is the same as that between the second electrode pads PD2 and the second opening OP2. Alternatively, the relative position between another electrode pad PD and the opening OP positioned thereover, for example, the relative position between the electrode pad PD adjacent to the first electrode PD1 and the opening OP thereover may be the same as that between the first electrode pad PD1 and the first opening OP1.

Figure 6:
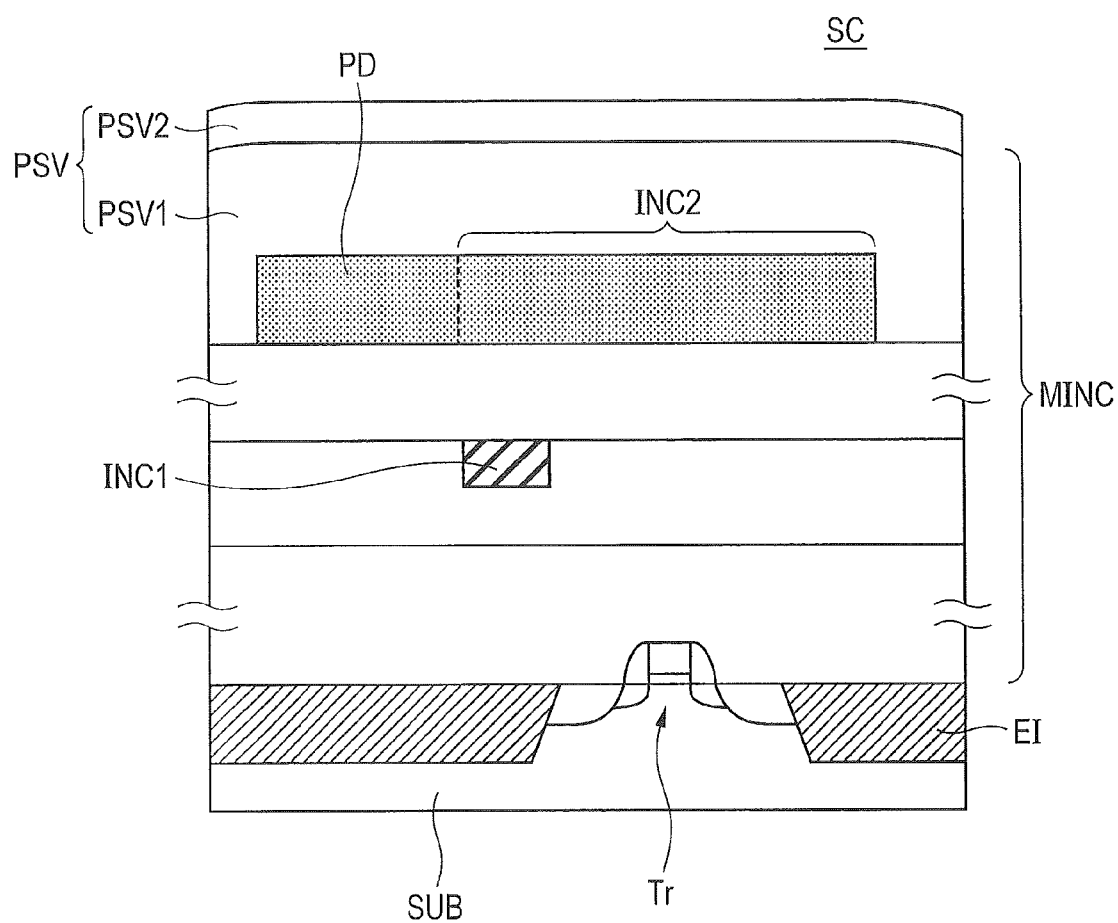
FIG. 6 is a cross-sectional view for explaining the structure of the semiconductor chip.

FIG. 6 shows a cross-sectional view for explaining the structure of a semiconductor chip SC. As mentioned above, the semiconductor chip SC has the substrate SUB. The substrate SUB is a semiconductor substrate, for example, a silicon substrate and the like. An element isolation film EI is formed in the substrate SUB. The element isolation film EI is formed, for example, by a STI method, but may be formed by a LOCOS method. A transistor TR is further formed over the substrate SUB. The element isolation film EI serves to isolate the transistor TR from other regions.

The multilayer interconnection layer MINC is formed over the substrate SUB, element isolation film EI, and transistor TR. At least one of wiring layers included in the multilayer interconnection layer MINC (for example, a layer with a wiring INC1 shown in the figure) is a copper wiring layer, which is formed by a Damascene method. The thickness of the wiring INC1 is, for example, not less than 0.1 μm nor more than 0.8 μm.

A plurality of electrode pads PD are formed over the uppermost wiring layer of the multilayer interconnection layer MINC. An insulating film serving as an underlayer for the electrode pad PD is, for example, a silicon oxide film. The electrode pad PD is formed, for example, using Al (or an Al alloy). A wiring INC2 is formed in the same layer as the electrode pad PD so as to be coupled to the electrode pad PD. In order to decrease the wiring resistance of the wiring INC2, the electrode pad PD and the wiring INC2 are formed more larger in thickness than the wiring INC1. The thickness of each of the electrode pad PD and wiring INC2 is, for example, 1.2 µm or more.

An insulating film PSV is formed over the electrode pad PD and wiring INC2. The insulating film PSV is formed of a laminate of a first insulating film PSV1 and a second insulating film PSV2. The first insulating film PSV1 is, for example, a silicon oxide film, and the second insulating film PSV2 is, for example, a silicon nitride film. The thickness of the insulating film PSV is larger than that of the electrode pad PD. In the example shown in the figure, the thickness of the first insulating film PSV1 is larger than that of the electrode pad PD.

Next, a manufacturing method of the semiconductor device SD in this embodiment will be described. First, the element isolation film EI is formed in the substrate SUB. In this way, a region where the transistor TR is formed (element formation region) is separated from other regions. Then, a gate insulating film and a gate electrode are formed in the substrate SUB positioned in the element formation region. The gate insulating film may be a silicon oxide film, or a high-dielectric constant film having a higher dielectric constant than that of the silicon oxide film (for example, a hafnium silicate film). When the gate insulating film is a silicon oxide film, the gate electrode is formed of a polysilicon film. When the gate insulating film is the high-dielectric constant film, the gate electrode is formed of a laminate of a metal film (for example, made of TiN) and a polysilicon film. When the gate electrode is formed of polysilicon, a polysilicon resistance may be formed over the element isolation film EI in a step of forming the gate electrode.

Then, extension regions for source and drain are formed in the substrate SUB positioned in the element formation region, followed by forming sidewalls on the side walls of the gate electrode. Thereafter, impurity regions serving as the source and drain are formed in the substrate SUB positioned in the element formation region. In this way, the transistor TR is formed over the substrate SUB.

Next, the multilayer interconnection layer MINC is formed over the substrate SUB, transistor TR, and element isolation film EI. In this step, the electrode pad PD is formed in the uppermost wiring layer. The electrode pad PD is formed, for example, by depositing an Al film, forming a resist pattern on the Al film, and then etching the Al film using the resist pattern as a mask.

Then, the first insulating film PSV1 and the second insulating film PSV2 are deposited over the multilayer interconnection layer MINC in that order. The first and second insulating films PSV1 and PSV2 are formed using, for example, a plasma CVD method. Thus, the insulating film PSV is formed.

Then, a resist pattern is formed on the second insulating film PSV2, and the insulating film PSV is etched using the resist pattern as a mask. Thus, the openings OP are formed. Then, the resist pattern is removed.

Thereafter, the substrate SUB is diced to be singulated into semiconductor chips SC.

The thus-obtained semiconductor chip SC is mounted over the substrate mounting portion DP, and the electrode pads PD of the semiconductor chip SC and the lead terminals LD are coupled together using the bonding wires WIR. Then, the seal resin MDR is formed by use of a die.

Next, the effects of the preferred embodiment of the invention will be described. This embodiment increases the thickness of the electrode pad, thereby decreasing the resistance of the wire located in the same layer as the electrode pad PD. In this case, the thermal stress generated between the seal resin MDR and the semiconductor chip SC is more likely to be applied to the electrode pad PD. In particular, the first electrode pad PD1 positioned near the corner of the substrate SUB has a large distance from the center of the substrate SUB as compared to other electrode pads PD, and thus can be subjected to the larger thermal stress than other electrode pads PD. In such a case, the first electrode pad PD1 can be peeled away from the insulating layer as the underlayer to be moved.

For this reason, in this embodiment, the center of the first electrode pad PD1 is positioned closer to the end of the first side SID1 as compared to the center of the first opening OP1. Thus, in a part of the first electrode pad PD1 covered with the insulating film PSV, a width of the part closer to the end of the first side SID1 in the direction along the first side SID1 is larger than another width of the part opposite to the above-mentioned width. A region of the first electrode pad PD1 to which the thermal stress is applied is pressed by the insulating film PSV, which prevents the first electrode pad PD1 from being peeled away from the underlayer. As a result, the first electrode pad PD1 is less likely to be moved.

In this embodiment, the thickness of the insulating film PSV is larger than the height of the electrode pad PD. Thus, a stepped portion between the electrode pad PD and the underlayer is filled with the insulating film PSV, which can decrease a stepped portion generated at the surface of the insulating film PSV due to the stepped portion between the electrode pad PD and the underlayer. With this arrangement, the thermal stress generated between the seal resin MDR and the semiconductor chip SC is less likely to be applied to the side surface of the electrode pad PD.

In this embodiment, the insulating film PSV is a laminate of the first insulating film PSV1 and the second insulating film PSV2. The first insulating film PSV1 is formed of a silicon oxide film, the second insulating film PSV2 is formed of a silicon nitride film, and the thickness of the first insulating film PSV1 is larger than that of the electrode pad PD. In this case, even when the thickness of the insulating film PSV becomes larger, this embodiment can suppress the increase in thermal stress that might be generated between the insulating film PSV and the multilayer interconnection layer MINC.

In all electrode pads PD, a distance from one of the short sides of the electrode pad PD close to the edge of the substrate SUB to the opening OP is larger than that from the remaining short side of the electrode pad PD (short side on the center side) to the opening OP. In other words, in a part of the electrode pad PD covered with the insulating film PSV, a width of the part closer to the edge of the substrate SUB in the direction getting close to the center of the substrate SUB from the edge of the substrate SUB is larger than another width of the part opposite to the above-mentioned width. With this arrangement, all the electrode pads PD are less likely to be moved even under the thermal stress.

First Modified Example

Figure 7:
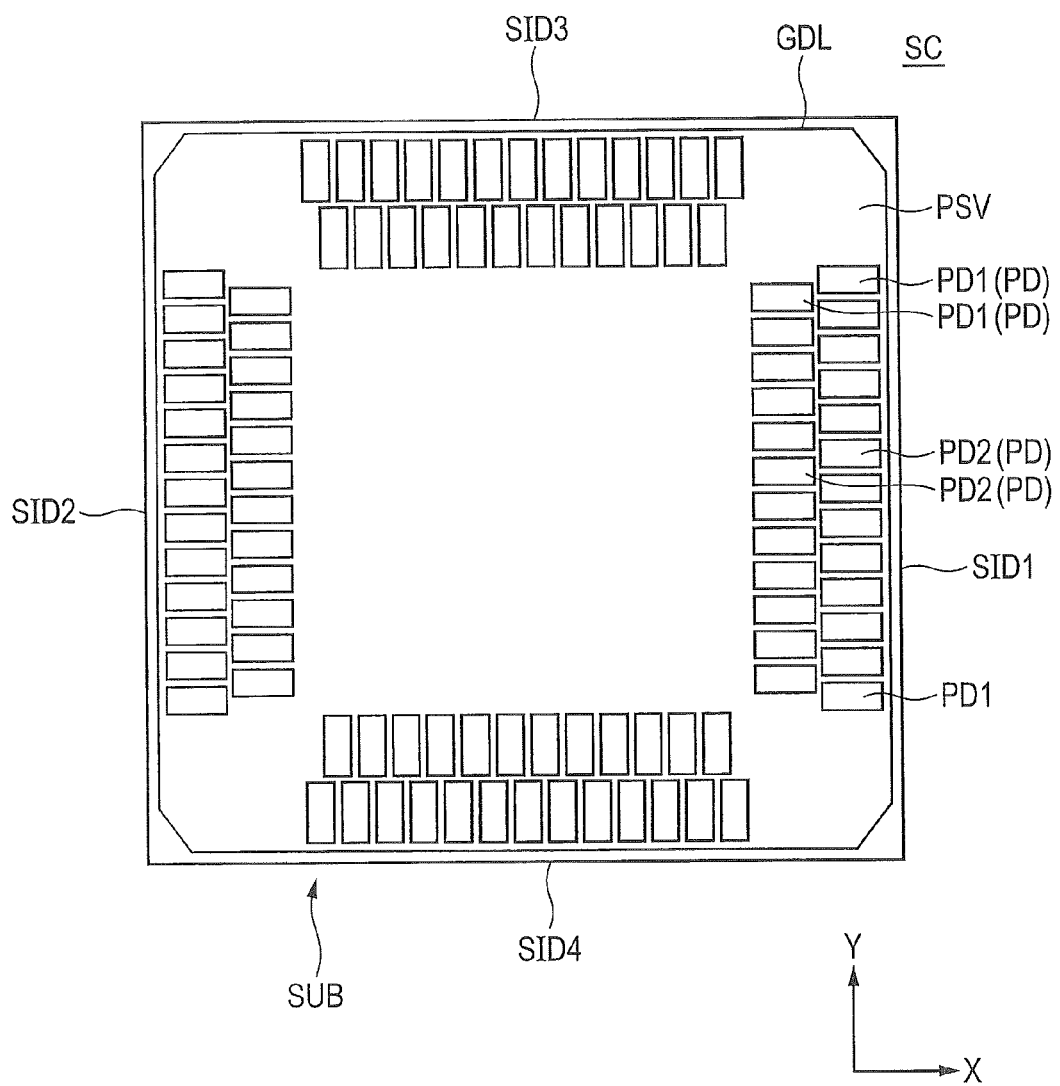
FIG. 7 is a plan view showing the structure of a semiconductor chip used in a semiconductor device according to a first modified example.
Figure 8:
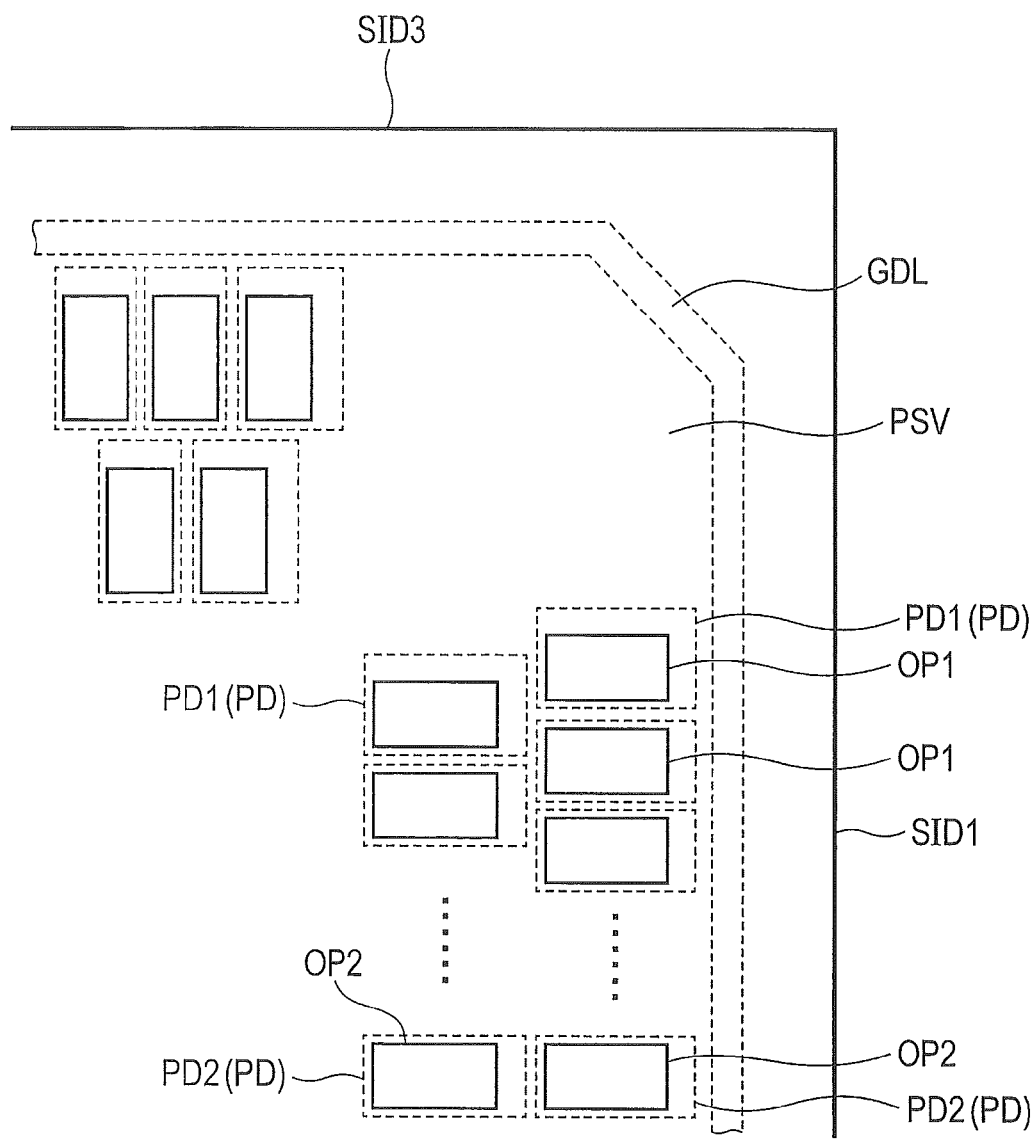
FIG. 8 is an enlarged diagram showing a main part of FIG. 7.

FIG. 7 shows a plan view of the structure of a semiconductor chip SC used in a semiconductor device SD in a first modified example, and corresponds to FIG. 2 according to the embodiment. FIG. 8 is an enlarged view of a main part of FIG. 7. The semiconductor device SD of this modified example has the same structure as that of the semiconductor device SD of the above embodiment except that the electrode pads PD of the semiconductor chip SC are arranged in a plurality of lines (for example, in two lines) along each side.

In detail, the electrode pads PD are arranged along each side in a staggered manner. In any line, the relative position between the first electrode pad PD1 closest to the end of each side (that is, the corner of the substrate SUB) and the first opening OP1 thereover in this modified example is the same as the relative position between the first electrode pad PD1 and the first opening OP1 in the above embodiment. In each line, the relative position between the second electrode pad PD2 and the second opening OP2 in this modified example is the same as that in the above embodiment.

This modified example can also obtain the same effects as those of this embodiment. In this modified example, in any line of the pads other than that on the outermost side, the relative position between the first electrode pad PD1 and the first opening OP1 thereover may be the same as that between the second electrode pad PD2 and the second opening OP2.

This modified example can also obtain the same effects as those of this embodiment.

Second Modified Example

Figure 9:
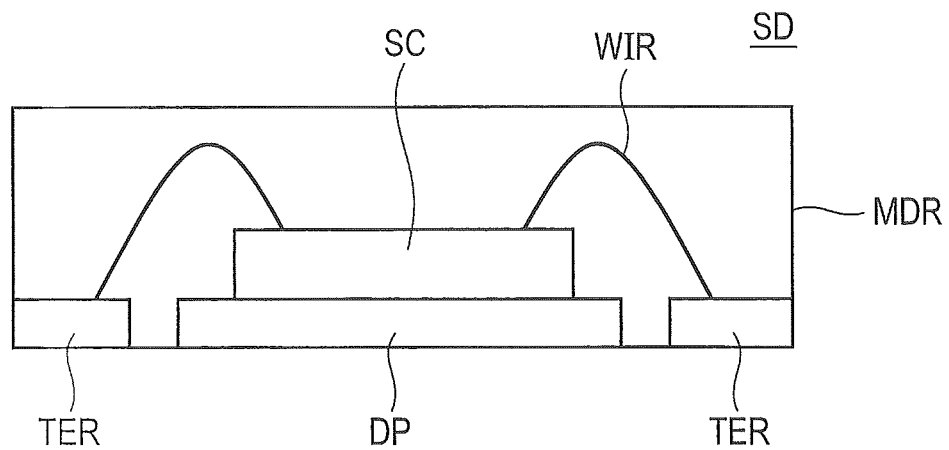
FIG. 9 is a cross-sectional view showing the structure of a semiconductor device according to a second modified example.

FIG. 9 shows a cross-sectional view of the structure of a semiconductor device SD according to a second modified example. The semiconductor device SD of this modified example has the same structure as that of the semiconductor device SD of the above embodiment or first modified example except that the semiconductor device SD has a quad flat no-lead package (QFN).

In detail, a surface of the substrate mounting portion DP where the semiconductor chip SC is not mounted is exposed from the seal resin MDR. A plurality of terminals TER are embedded in a surface of the seal resin MDR with the substrate mounting portion DP exposed therefrom. The terminals TER are arranged along four sides of the seal resin MDR.

This modified example can also obtain the same effects as those of this embodiment.

Third Modified Example

Figure 10:
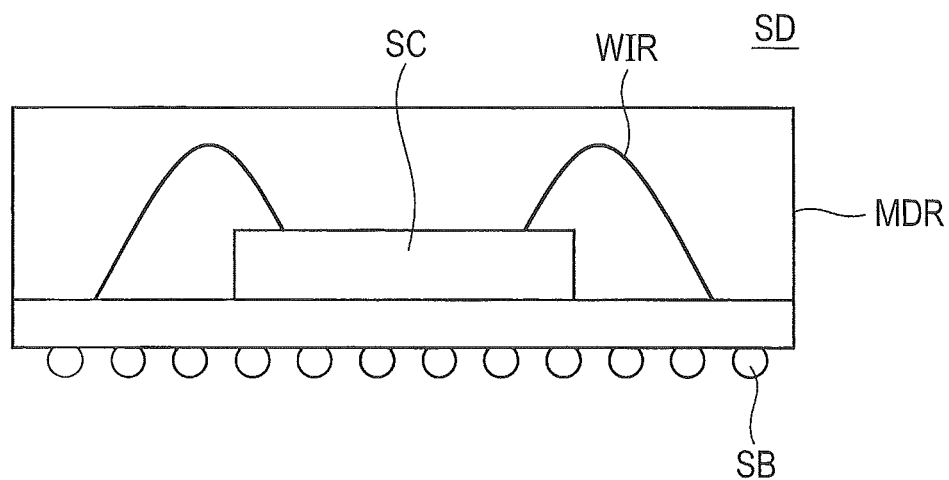
FIG. 10 is a cross-sectional view showing the structure of a semiconductor device according to a third modified example.

FIG. 10 shows a cross-sectional view of the structure of a semiconductor device SD according to a third modified example. The semiconductor device SD of this modified example has the same structure as that of the semiconductor device SD of the above embodiment or first modified example except that the semiconductor chip SC is mounted over the wiring substrate IP, such as an interposer.

Specifically, the semiconductor chip SC is held over the wiring substrate IP with an electrode formation surface of the chip faced upward. A terminal (for example, finger) over the wiring substrate IP is coupled to the electrode pad PD of the semiconductor chip SC via the bonding wires WIR.

The semiconductor chip SC, the surface of the wiring substrate IP with the semiconductor chip SC mounted thereon, and the bonding wire WIR are sealed by the seal resin MDR. In the example shown in the figure, the side surface of the seal resin MDR is flush with the side surface of the wiring substrate IP. Alternatively, the side surface of the seal resin MDR may be positioned inside the wiring substrate IP.

Solder balls SB are provided at the surface of the wiring substrate IP not sealed with the seal resin MDR. Each solder ball SB is coupled to the semiconductor chip SC via the wiring in the wiring substrate IP and the bonding wire WIR.

This modified example can also obtain the same effects as those of this embodiment.

Although the present invention made by the inventors has been specifically described based on the embodiment and modified examples, the present invention is not limited to the embodiment and modified examples described above, and various modifications and changes can be made to the above embodiment and modified examples without departing from the scope of the invention.

What is claimed is:

1. A semiconductor device, comprising:
a substrate having a first surface and a second surface opposite the first surface;
a semiconductor chip having a first main surface, a second main surface opposite the first main surface and a first side on the first main surface, the semiconductor chip mounted on the substrate such that the second main surface is faced to the first surface of the substrate, the semiconductor chip including:
a first electrode pad arranged along the first side on the first main surface;
an insulating film formed over the first electrode on the first main surface, the insulating film having a first opening exposing a first part of the first electrode pad;
a first electrode disposed outside of the semiconductor chip and arranged along the first side of the semiconductor chip, and the first electrode being connected with the first electrode pad on the semiconductor chip via a first wiring; and
a sealed resin body sealing the substrate, the semiconductor chip, the first electrode, the first electrode pad and the first wiring,
wherein an area of the first opening is smaller than an area of the first electrode pad in a plan view,
wherein the first electrode pad is the closest to one end of the first side of the semiconductor chip,
wherein a center of the first electrode pad is positioned closer to the one end in a direction along the first side as compared to a center of the first opening, and
wherein the first wiring is joined with the first part of the first electrode pad on the semiconductor chip.

2. The semiconductor device according to claim 1, wherein the semiconductor chip further includes:
a second electrode pad being the closet to a center portion of the first side on the first main surface; and
a second opening exposing a second part of the second electrode pad in the insulating film, and
wherein a distance between a center of the second electrode pad and a center of the second opening is smaller than that between the center of the first electrode pad and the center of the first opening in the direction along the first side of the semiconductor chip in the plan view.

3. The semiconductor device according to claim 2, wherein in the direction along the first side, a width of the first opening is the same as that of the second opening, and a width of the first electrode pad is larger than that of the second electrode pad.

4. The semiconductor device according to claim 1, wherein the first electrode pad has a thickness of 1.2 µm or more in a direction from the first main surface of semiconductor chip to the second main surface or the semiconductor chip.

5. The semiconductor device according to claim 1, wherein the thickness of the insulating film is larger than that of the electrode pad in a direction from the first main surface of semiconductor chip to the second main surface of the semiconductor chip.

6. The semiconductor device according to claim 1, wherein the first electrode is arranged on the first surface of the substrate.

7. The semiconductor device according to claim 2, wherein the semiconductor device further comprises:
   a second electrode disposed outside of the semiconductor chip and arranged along the first side of the semiconductor chip,
wherein the second electrode is connected with the second electrode pad on the semiconductor chip via a second wiring, and
wherein a second wiring is joined with the second part of the second electrode pad on the semiconductor chip.

8. The semiconductor device according to claim 1, wherein a distance from the center of the first opening to a first edge of the first electrode pad nearest the first side is greater than a distance from the center of the first opening to a second edge of the first electrode pad furthest from the first side.

9. The semiconductor device according to claim 1, wherein a distance from the center of the first opening to a first corner of the first electrode pad adjacent to the first side is greater than a distance from the center of the first opening to a second corner of the first electrode pad further from the first side than the first corner.

10. The semiconductor device according to claim 1, wherein a surface area of the first surface of the substrate is less than a surface area of the second main surface of the semiconductor chip.

11. The semiconductor device according to claim 1, wherein a surface area of the first surface of the substrate is greater than a surface area of the second main surface of the semiconductor chip.

12. The semiconductor device according to claim 7, wherein the insulating film further comprises a second opening exposing a first part of the second electrode pad.

13. The semiconductor device according to claim 12, wherein a distance from a center of the second opening to a first edge of the second electrode pad nearest the first side is greater than a distance from the center of the second opening to a second edge of the second electrode pad furthest from the first side.

14. The semiconductor device according to claim 12, wherein a distance from a center of the second opening to a first corner of the second electrode pad adjacent to the first side is greater than a distance from the center of the second opening to a second corner of the second electrode pad further from the first side than the first corner.

* * * * *